(12) United States Patent
Badia

(10) Patent No.: US 10,670,212 B2
(45) Date of Patent: Jun. 2, 2020

(54) HOUSING FOR A PRINTED CIRCUIT BOARD FOR A LIGHTING DEVICE FOR A MOTOR VEHICLE

(71) Applicant: VALEO VISION, Bobigny (FR)

(72) Inventor: Olivier Badia, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 16/170,658

(22) Filed: Oct. 25, 2018

(65) Prior Publication Data

US 2019/0120455 A1    Apr. 25, 2019

(30) Foreign Application Priority Data

Oct. 25, 2017  (FR) ..................................... 17 60076

(51) Int. Cl.

| F21S 41/19 | (2018.01) |
|---|---|
| F21S 45/47 | (2018.01) |
| F21S 41/141 | (2018.01) |
| H05K 5/06 | (2006.01) |
| F21Y 115/10 | (2016.01) |
| B60Q 1/00 | (2006.01) |

(52) U.S. Cl.
CPC ........... *F21S 41/192* (2018.01); *F21S 41/141* (2018.01); *F21S 45/47* (2018.01); *H05K 5/061* (2013.01); *B60Q 1/0094* (2013.01); *F21Y 2115/10* (2016.08)

(58) Field of Classification Search
CPC ...... H05K 7/1427; H05K 5/03; H05K 5/0247; F21S 41/192; F21S 41/141; F21S 45/47
See application file for complete search history.

(56) References Cited

U.S. PATENT DOCUMENTS

| 6,407,925 B1 | 6/2002 | Kobayashi et al. |
|---|---|---|
| 2002/0112870 A1 | 8/2002 | Kobayashi et al. |
| 2014/0334115 A1 | 11/2014 | Yang et al. |
| 2014/0334116 A1 | 11/2014 | Lee et al. |
| 2015/0092437 A1 | 4/2015 | Arita |
| 2017/0332505 A1 | 11/2017 | Arita |

FOREIGN PATENT DOCUMENTS

| FR | 3 005 550 A1 | 11/2014 |
|---|---|---|
| FR | 3 005 551 A1 | 11/2014 |
| FR | 3 041 211 A1 | 3/2017 |

OTHER PUBLICATIONS

French Preliminary Search Report dated Jun. 14, 2018 in French Application 17 60076 filed on Oct. 25, 2017 (with English Translation of Categories of Cited Documents).

*Primary Examiner* — Joseph L Williams
(74) *Attorney, Agent, or Firm* — Oblon, McClelland, Maier & Neustadt, L.L.P.

(57) ABSTRACT

A housing for a printed circuit board for a lighting device for a motor vehicle. The housing includes a protective cover designed to be arranged on a heat sink, the heat sink being designed to receive the printed circuit board, a primary seal arranged between the protective cover and the heat sink close to the perimeter of the heat sink, and a protection device for the primary seal.

20 Claims, 13 Drawing Sheets

A-A

Figure 1:
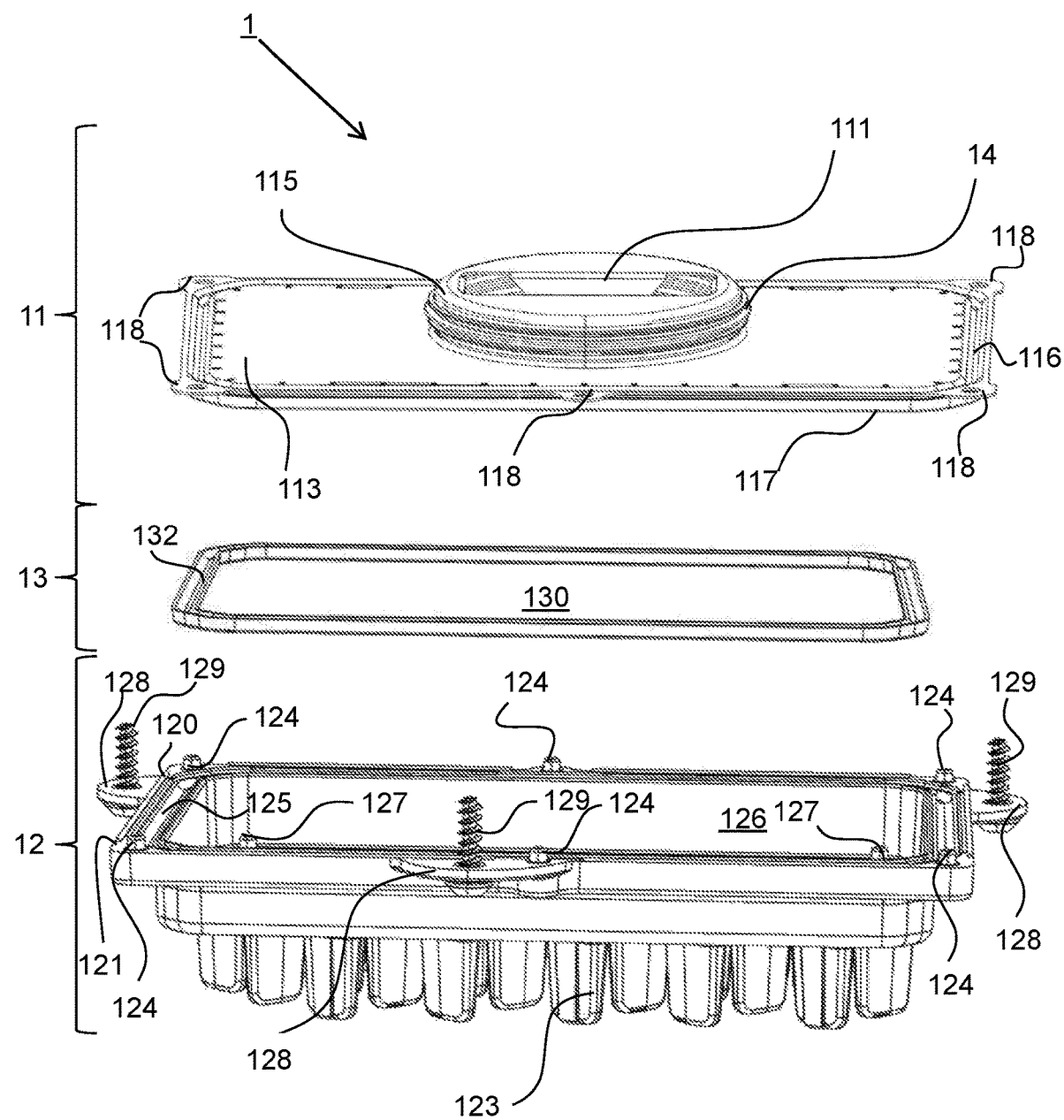

HOUSING FOR A PRINTED CIRCUIT BOARD FOR A LIGHTING DEVICE FOR A MOTOR VEHICLE

TECHNICAL FIELD OF THE INVENTION

The present invention relates to a housing for a printed circuit board for a lighting device for a motor vehicle.

The invention is particularly applicable in, without being limited to, the domain of devices for controlling the electrical power supply of a light source.

TECHNOLOGICAL BACKGROUND TO THE INVENTION

In a manner known to a person skilled in the art, a housing for a printed circuit board for a lighting device for a motor vehicle includes:
 a protective cover designed to close said housing, and
 a heat sink designed to evacuate the heat released by the electronic components of the printed circuit board.

The lighting device has at least one light source. The printed circuit board has at least one electronic component for controlling the electrical power supply of said light source, and is arranged between the heat sink and the protective cover of said housing.

Said housing for a printed circuit board is assembled on a secondary housing for a lighting device.

A protective wall on the secondary housing surrounds the housing for a printed circuit board such as to protect the assembly zone between the protective cover and the heat sink. The protective wall runs about the perimeter of the heat sink with an assembly clearance of a few tenths of a millimeter between the protective wall and said heat sink. The electronic control component is thus confined by said protective wall beside the secondary housing. This helps to ensure the seal of the electronic components of the printed circuit board, in particular of said electronic control component, against attack from a pressurized fluid.

One drawback of this prior art is that this confinement creates unfavorable thermal conditions. Consequently, the heat released notably by the electronic components of the printed circuit board is not adequately dissipated.

In this context, the present invention is intended to address the aforementioned drawback.

GENERAL DESCRIPTION OF THE INVENTION

For this purpose, the invention proposes a housing for a printed circuit board for a lighting device for a motor vehicle, said housing comprising:
 a protective cover designed to be arranged on a heat sink, said heat sink designed to receive said printed circuit board,
 a primary seal arranged between said protective cover and said heat sink close to the perimeter of the heat sink, and
 a protection device for said primary seal.

Thus, as described below, the protection device is designed to protect the primary seal arranged between the protective cover and the heat sink against attack from a pressurized fluid directed towards said housing, for example pressurized water. Indeed, such a pressurized fluid could damage the seal and, over time, alter the effectiveness of said seal. Furthermore, the protection device is arranged such as to enable an air flow to come into direct contact with the protective cover to facilitate evacuation of the heat to outside the housing for the printed circuit board.

According to non-limiting embodiments, the housing for a printed circuit board can also have one or more of the following additional features:

According to one non-limiting embodiment, said protective cover has an opening on the side opposite the heat sink that is designed to receive a connector.

According to one non-limiting embodiment, said protective cover has a secondary seal arranged beside said opening.

According to one non-limiting embodiment, said protection device has at least one wall arranged on at least one portion of the perimeter of said heat sink.

According to one non-limiting embodiment, said at least one wall is flush with or projects beyond the protective cover.

According to one non-limiting embodiment, said protection device has a flanged edge arranged on said protective cover that is designed to rest on at least one portion of the perimeter of said heat sink.

According to one non-limiting embodiment, said heat sink and/or said protective cover is flat or has projections.

A control device is also proposed for controlling the electrical power supply for at least one light source for a lighting device, in which said control device has a housing according to any one of the aforementioned features and a printed circuit board seated in said housing.

An assembly is also proposed for a lighting device for a motor vehicle including a housing for a printed circuit board according to any one of the aforementioned features, that is assembled with a secondary housing for a lighting device.

According to one non-limiting embodiment, said secondary housing has at least one attachment device for said housing.

According to one non-limiting embodiment, said secondary housing has at least one bearing device for said housing.

According to one non-limiting embodiment, said secondary housing has at least one guide device for said housing.

According to one non-limiting embodiment, said at least one guide device is a rib.

According to one non-limiting embodiment, said at least one guide device is a gutter.

According to one non-limiting embodiment, said secondary housing has a protective wall arranged at a distance from the perimeter of said heat sink of the housing for the printed circuit board.

According to one non-limiting embodiment, said protective wall is arranged at a distance substantially between 5 mm and 10 mm from the perimeter of the heat sink.

A lighting device for a motor vehicle is also proposed, in which said lighting device has:
 at least one light source designed to emit light rays,
 an optical module designed to cooperate with said light rays from said at least one light source,
 a housing for a printed circuit board according to any one of the aforementioned features,
 a printed circuit board seated in said housing, and
 a secondary housing designed to be assembled with said housing for a printed circuit board.

SHORT DESCRIPTION OF THE FIGURES

The invention and the different applications thereof can be better understood from the description below and the accompanying figures.

Figure 2:
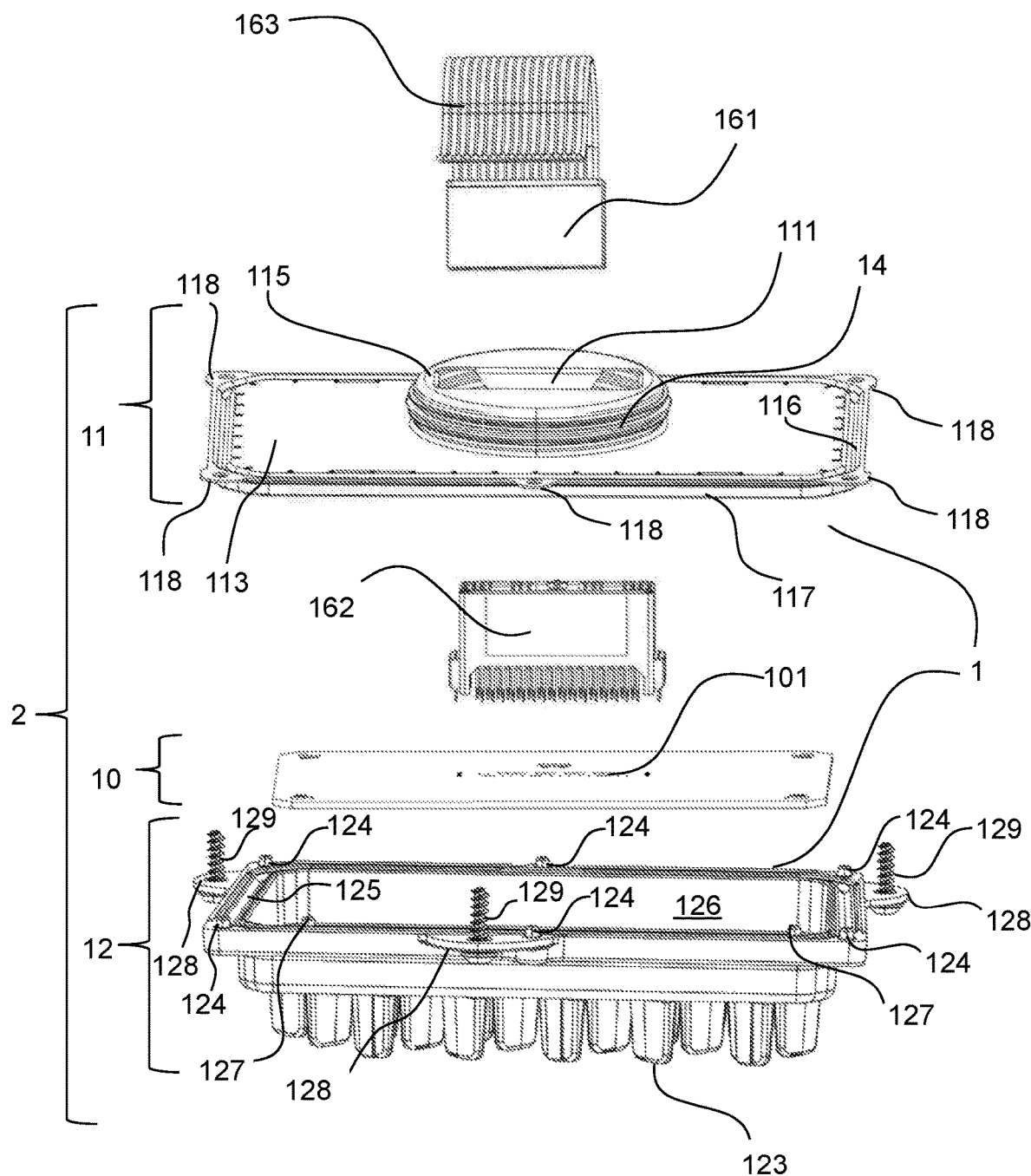
Figure 3:
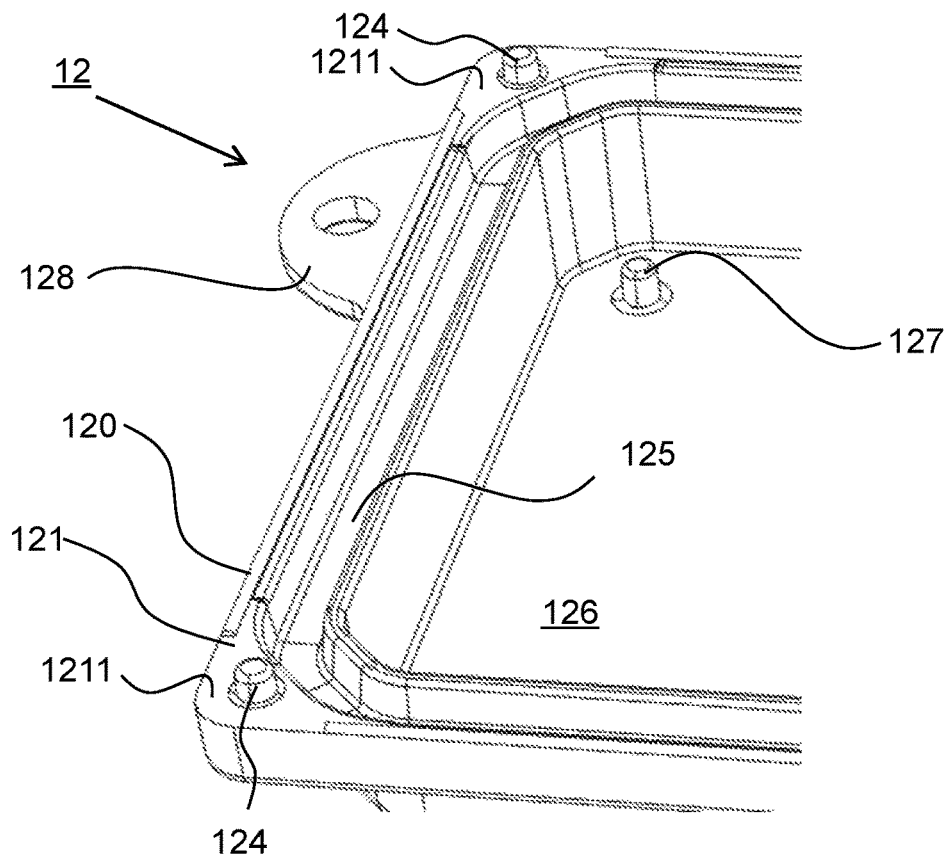
Figure 4:
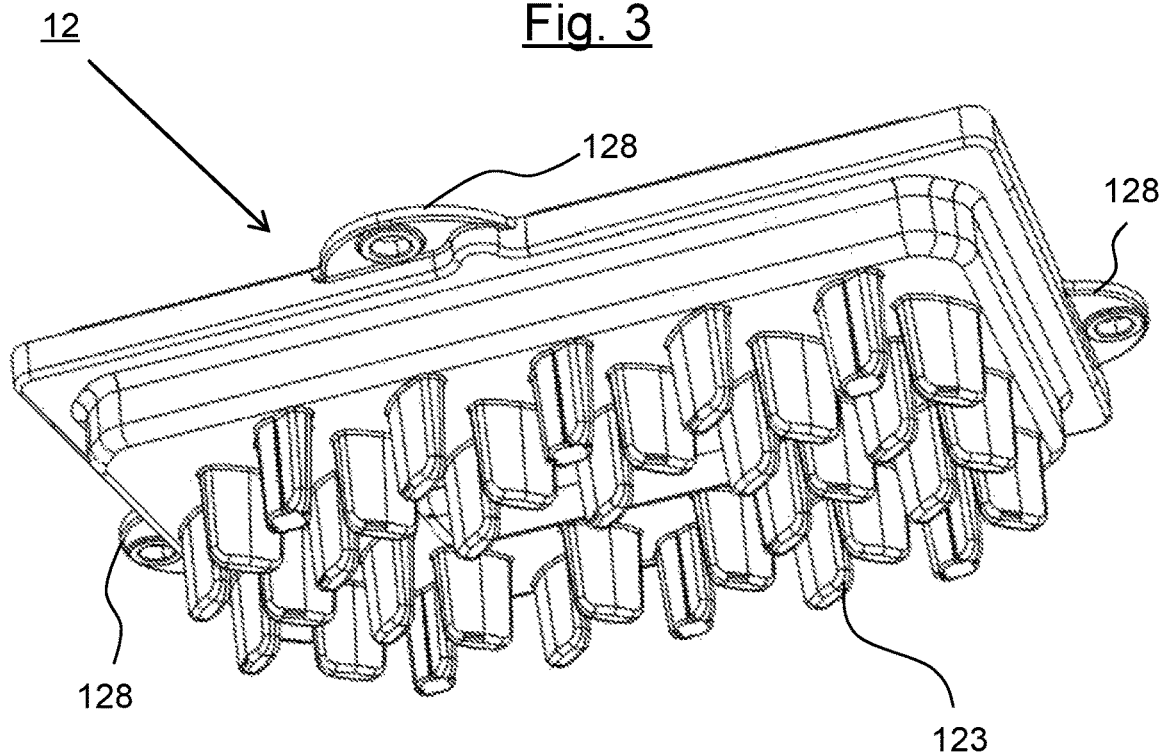
Figure 5:
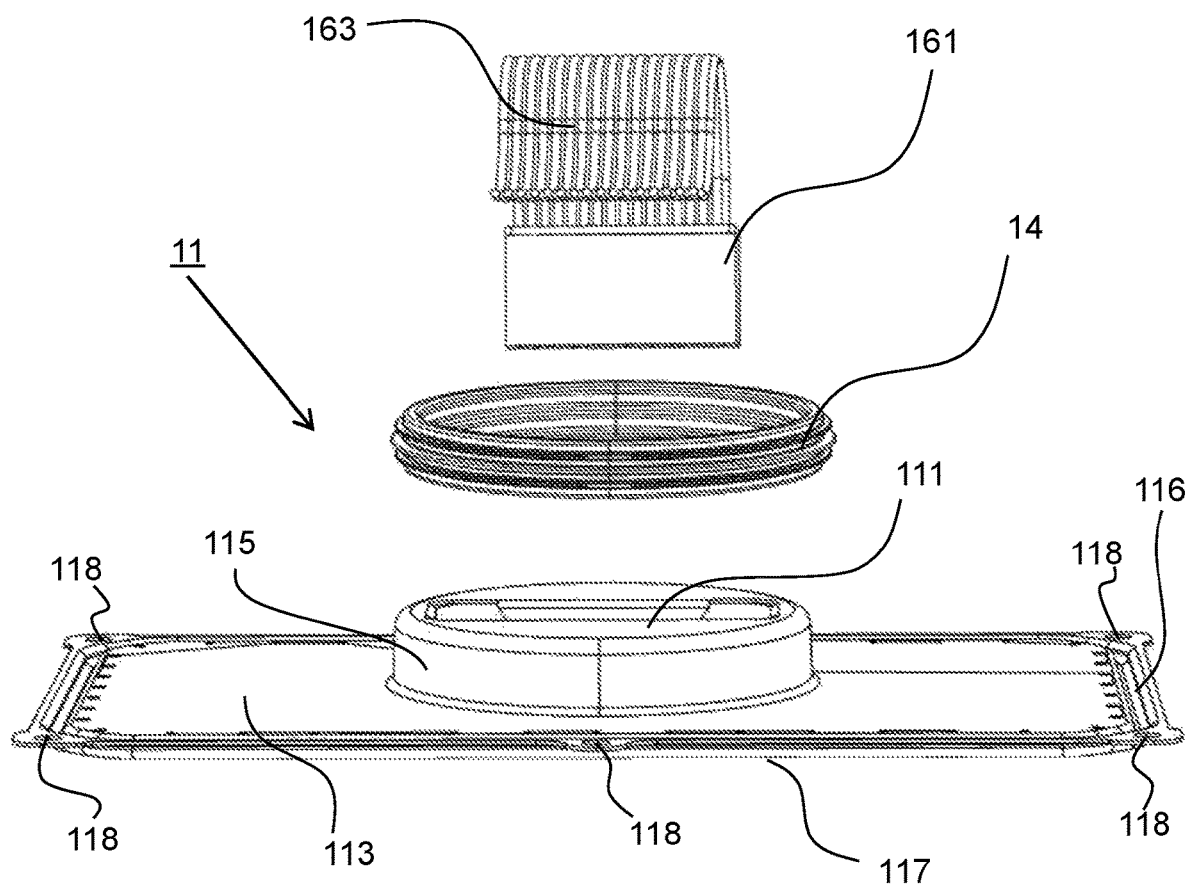
Figure 6:
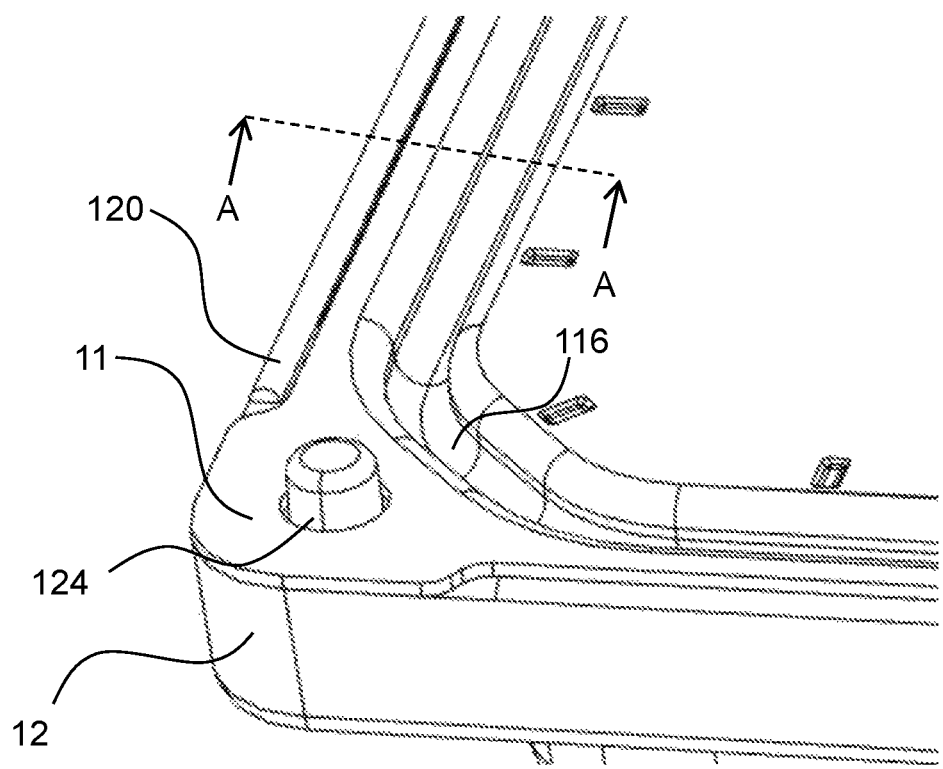
Figure 7:
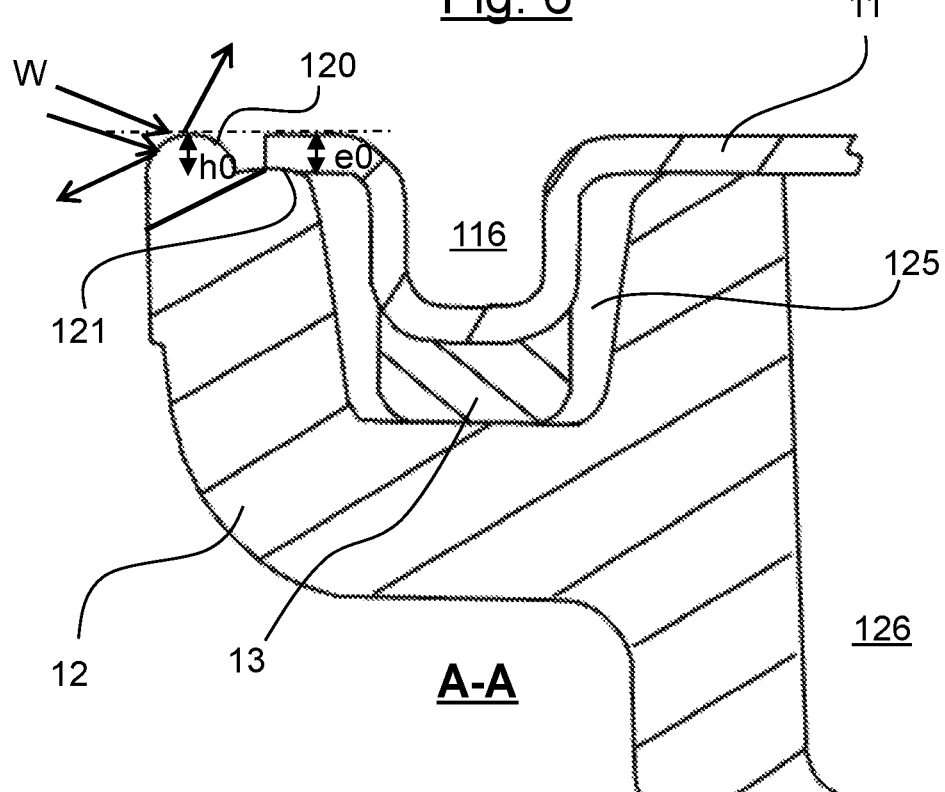
Figure 8:
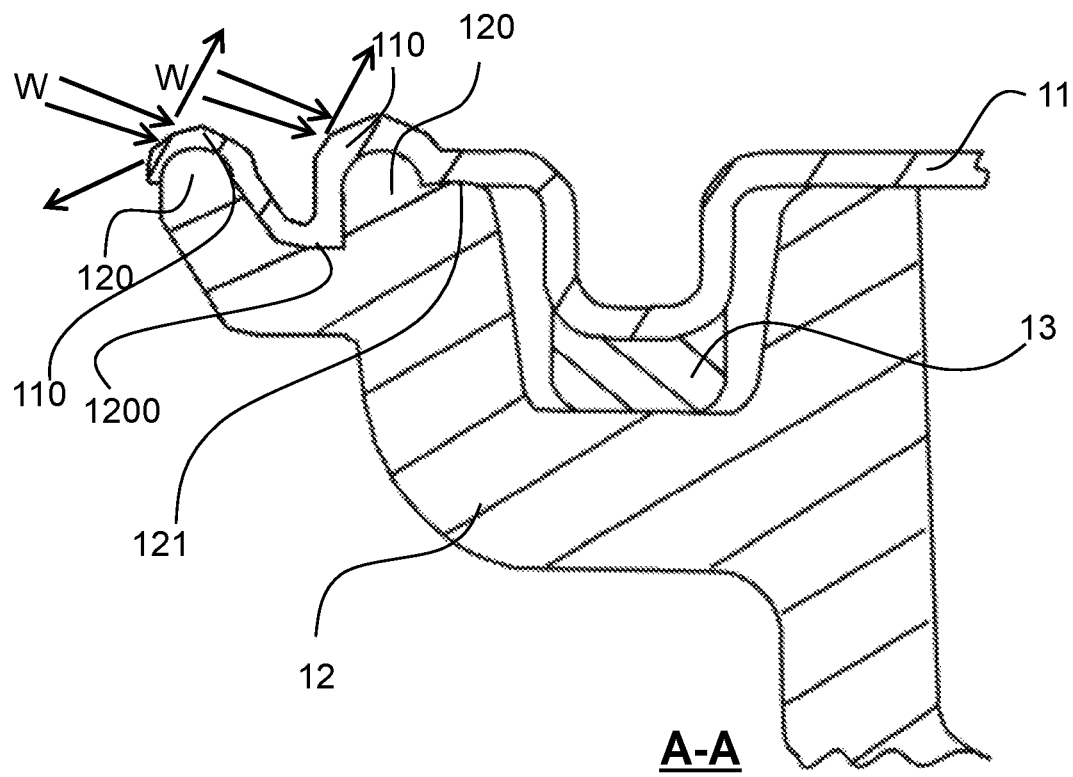
Figure 9:
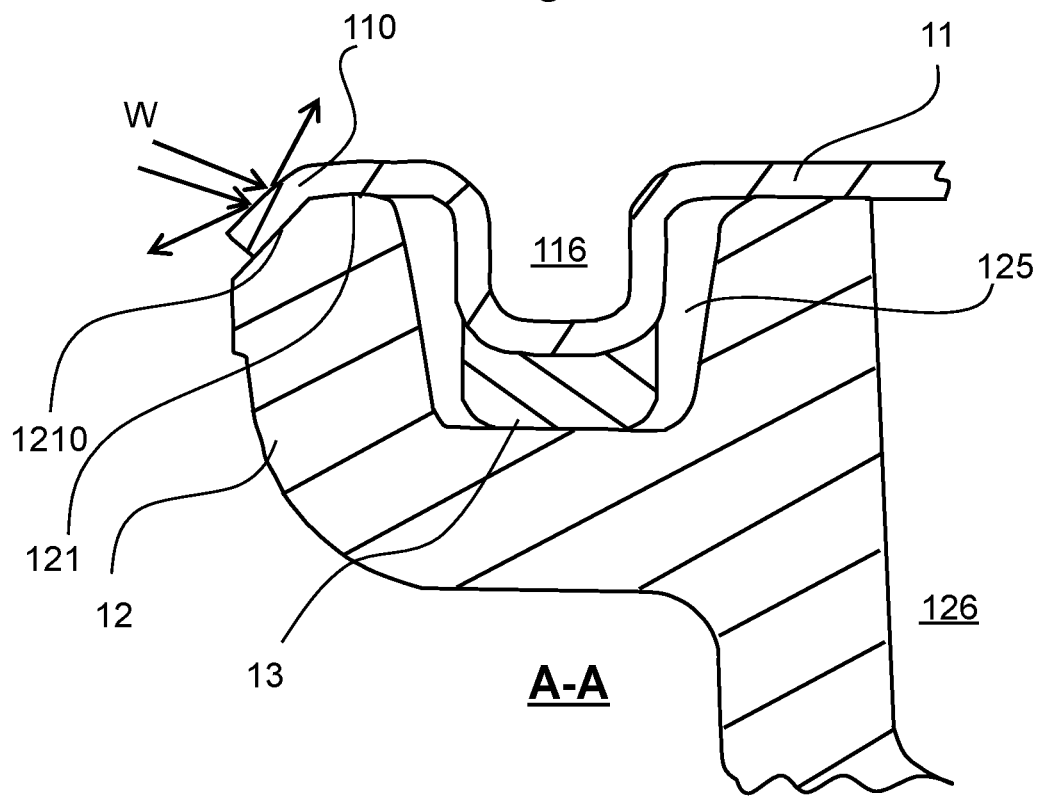
Figure 10:
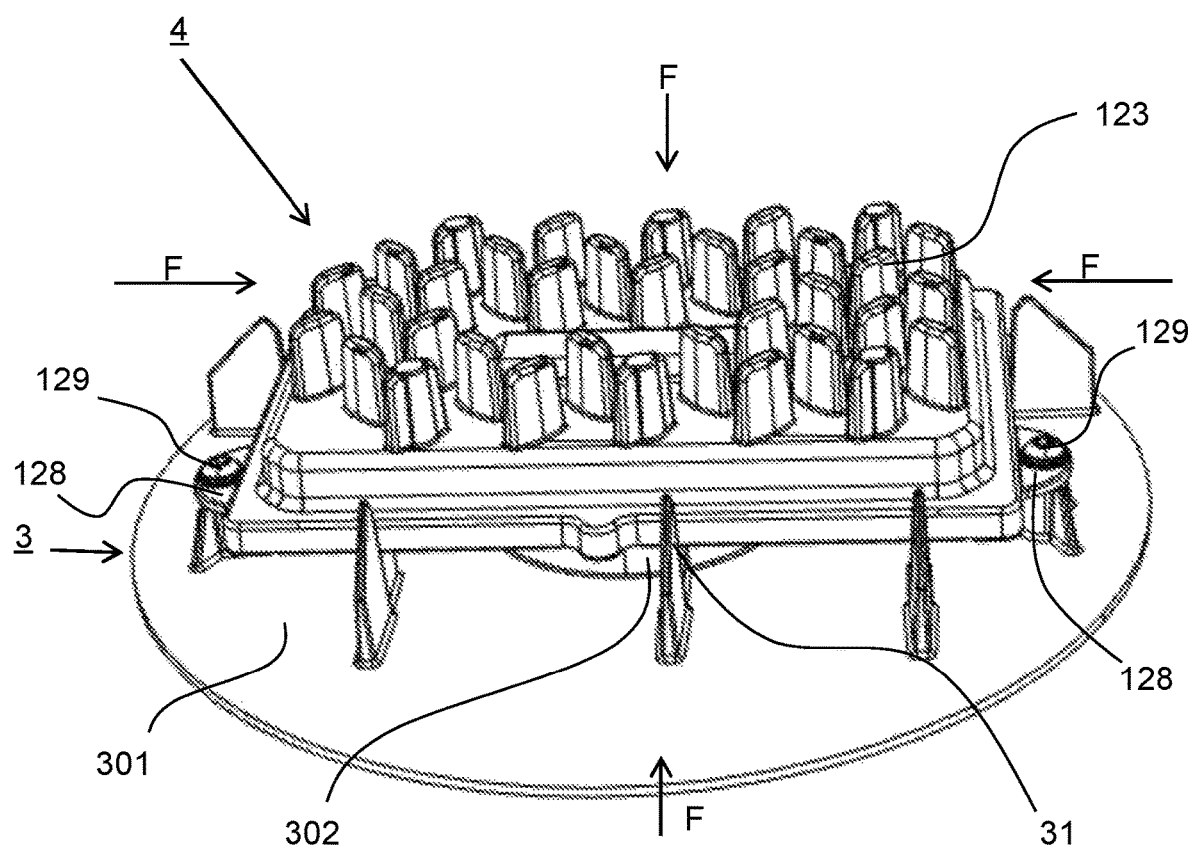
Figure 11:
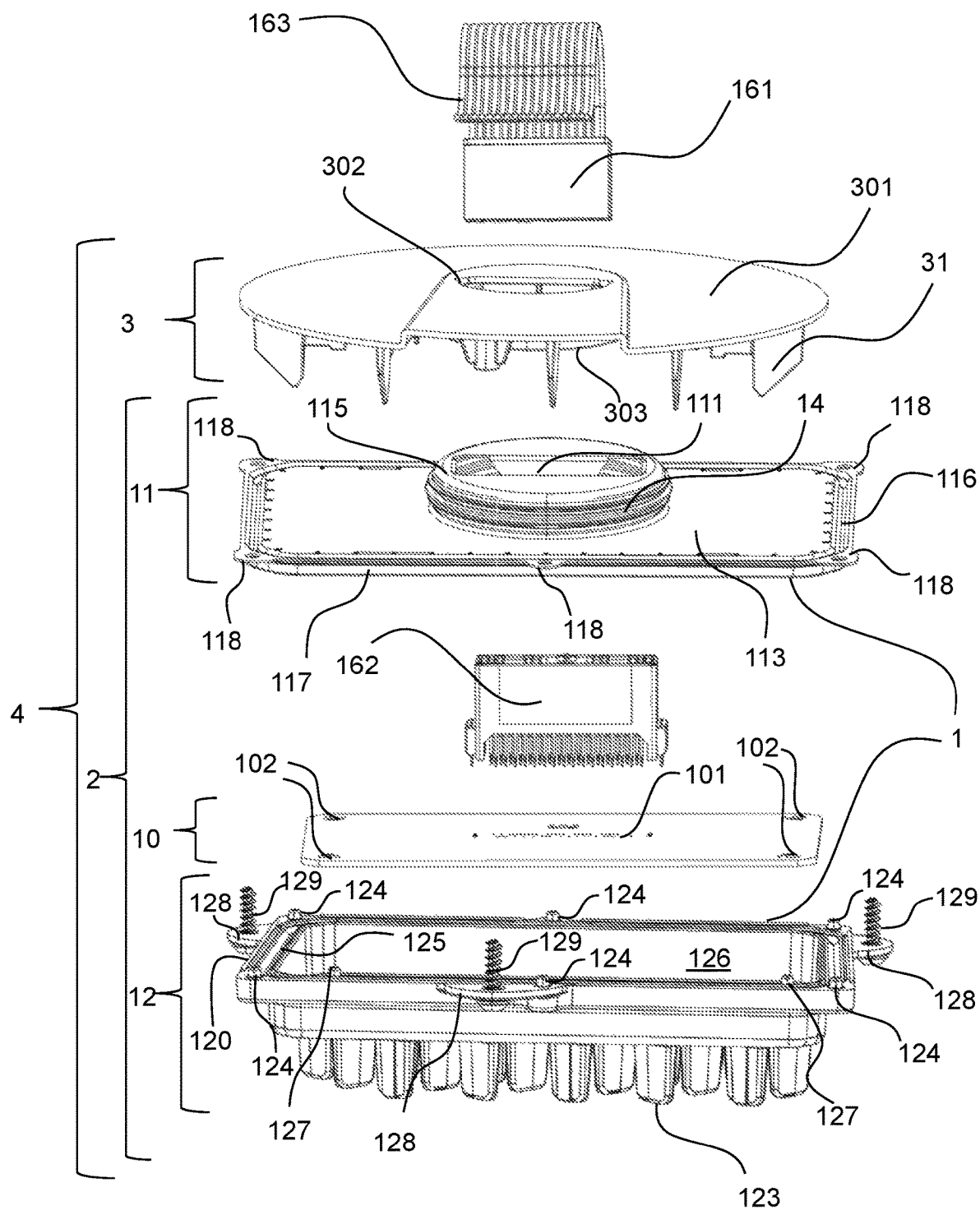
Figure 12:
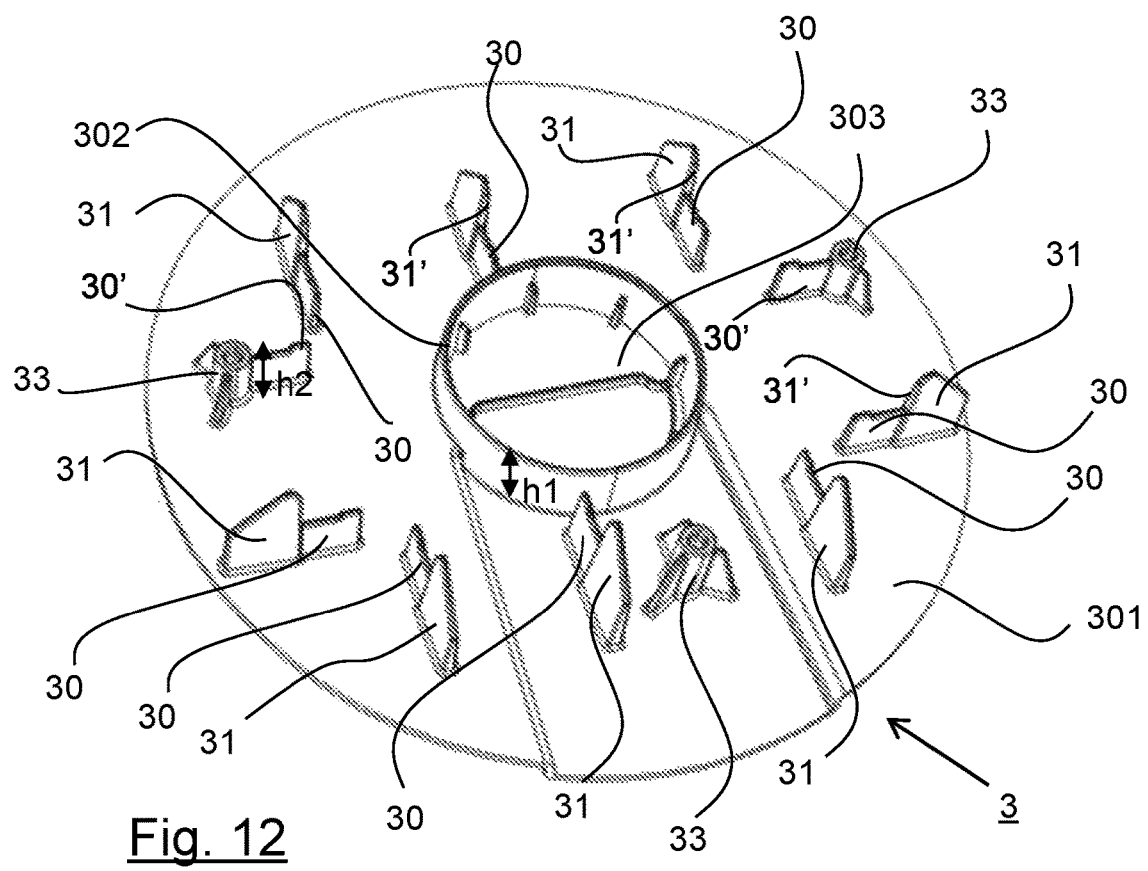
Figure 13:
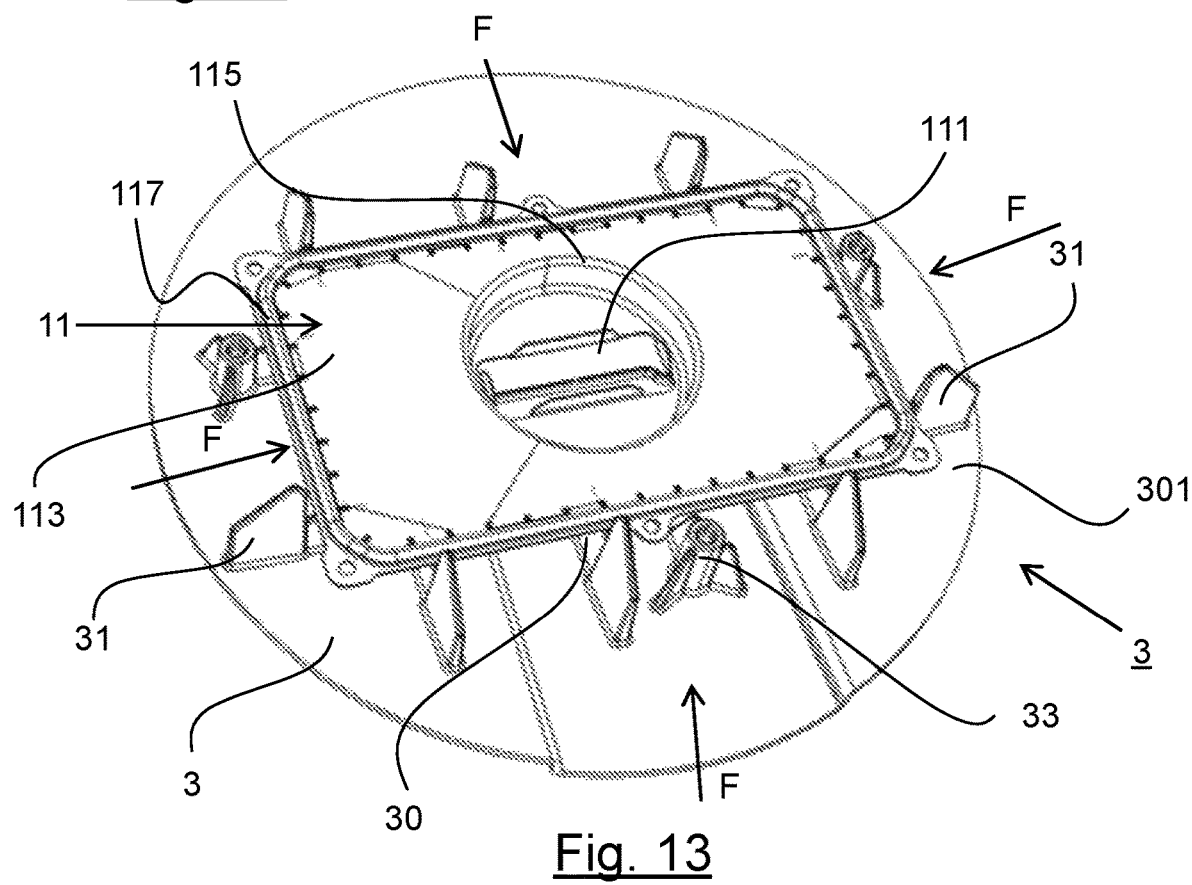
Figure 14:
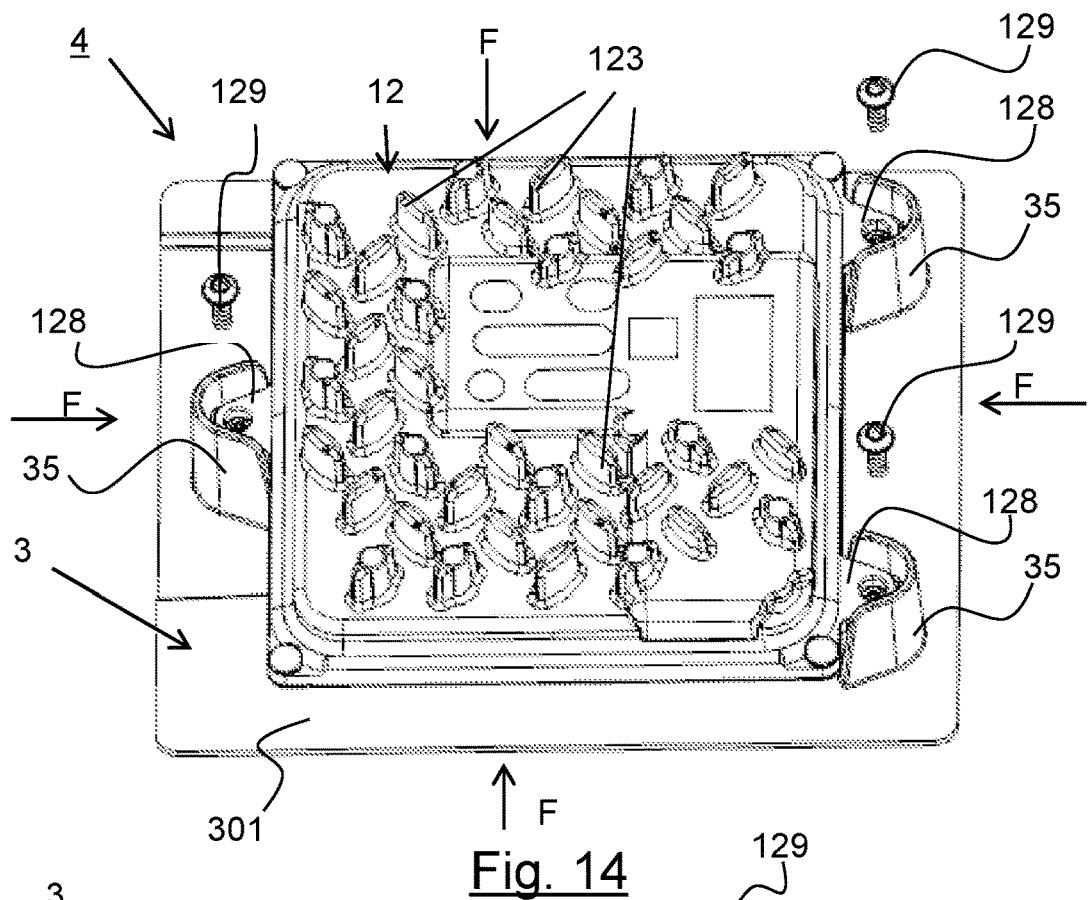
Figure 15:
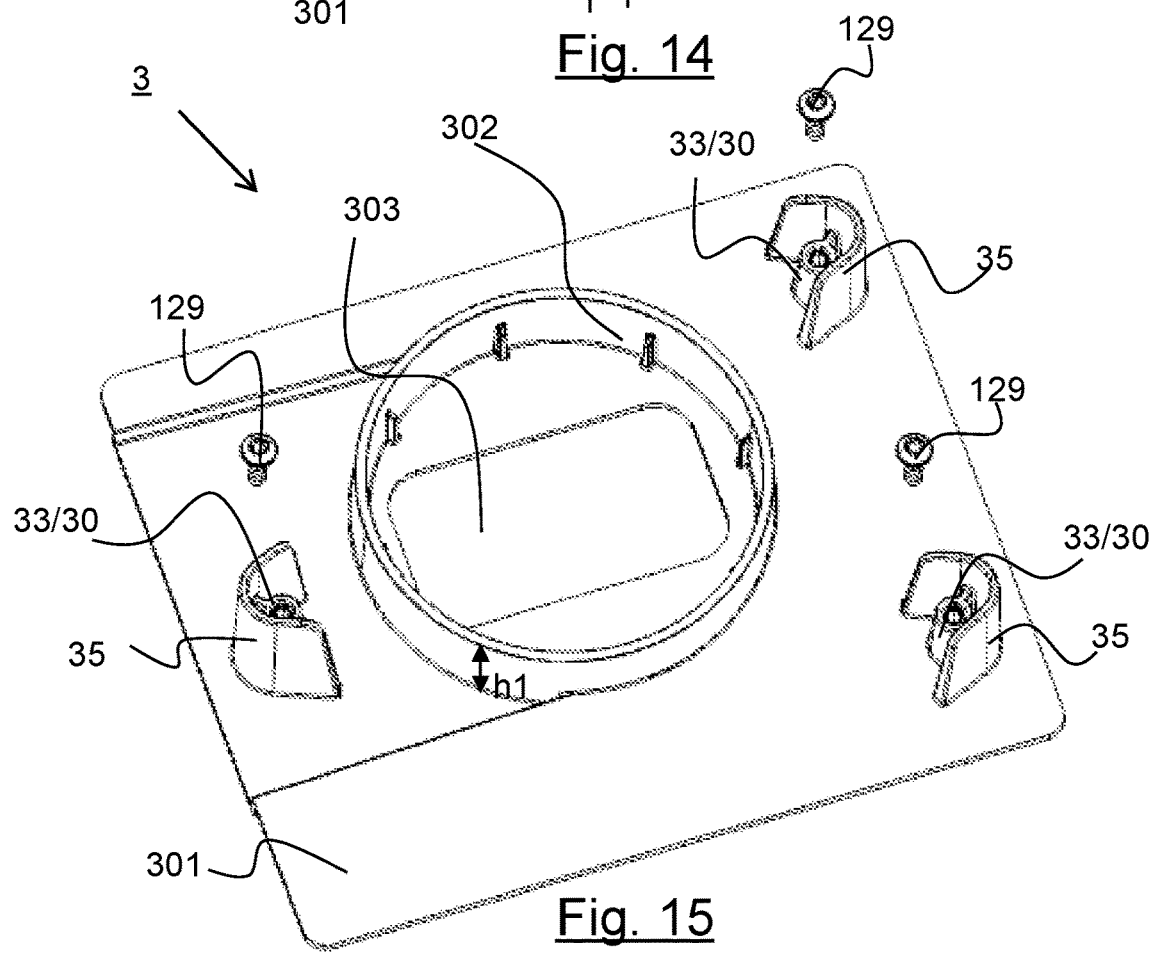
Figure 16:
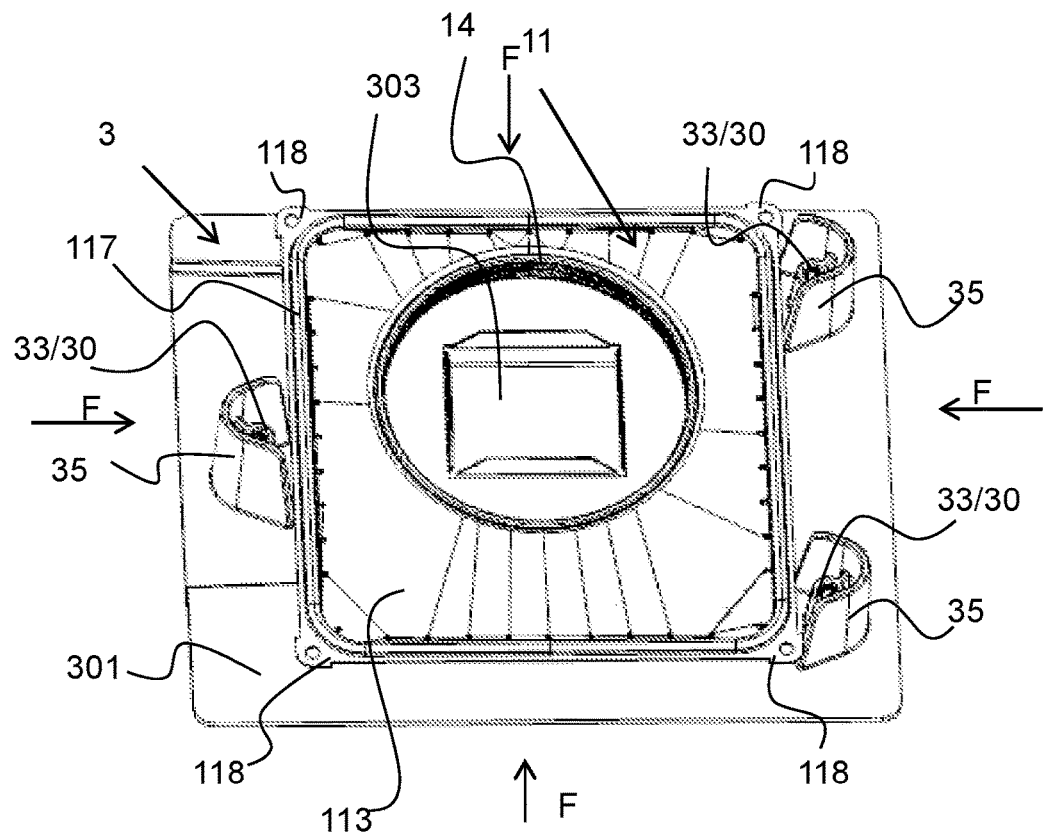
Figure 17:
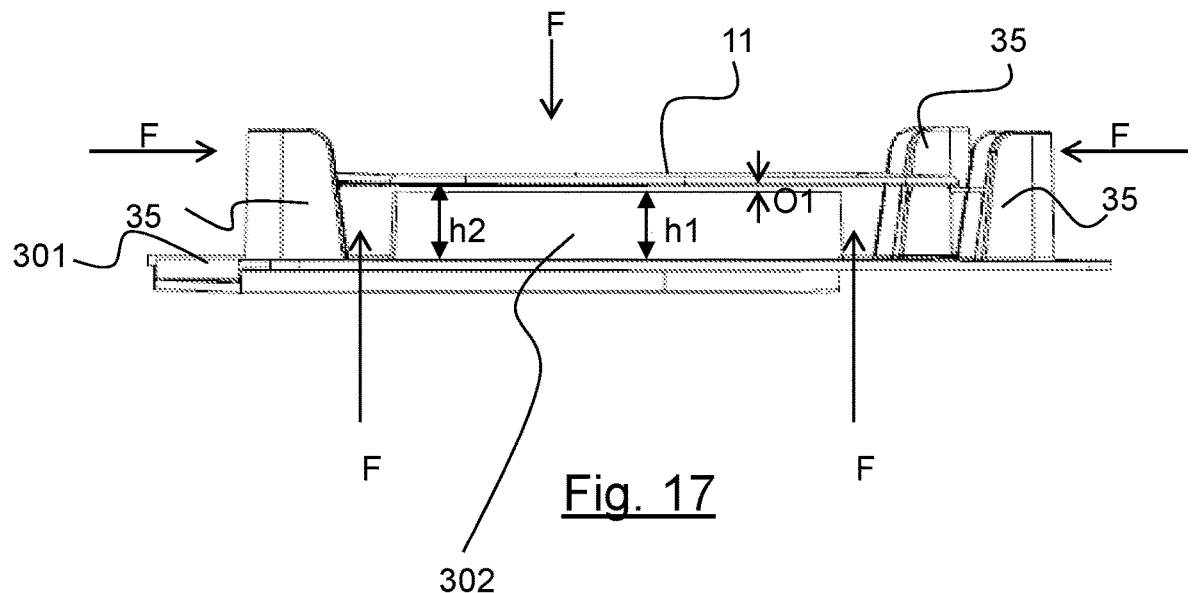
Figure 18:
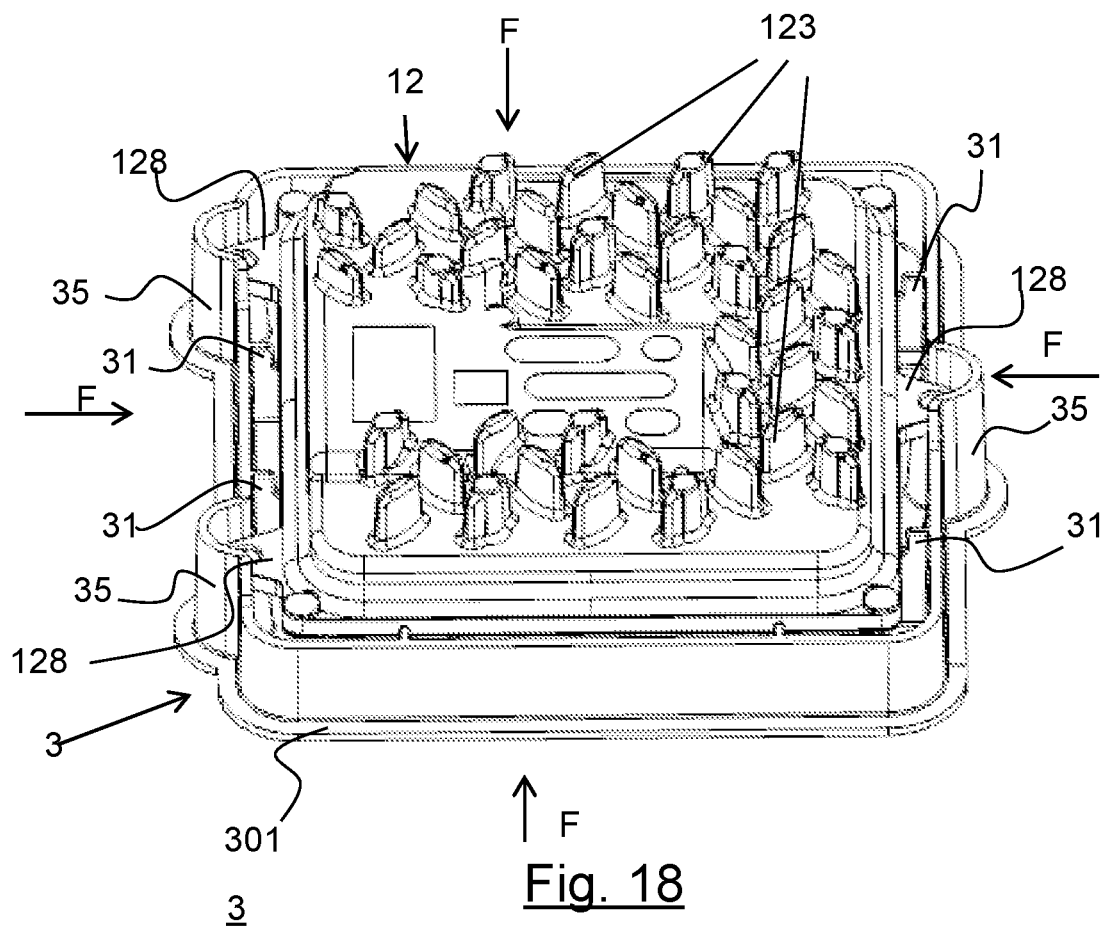
Figure 19:
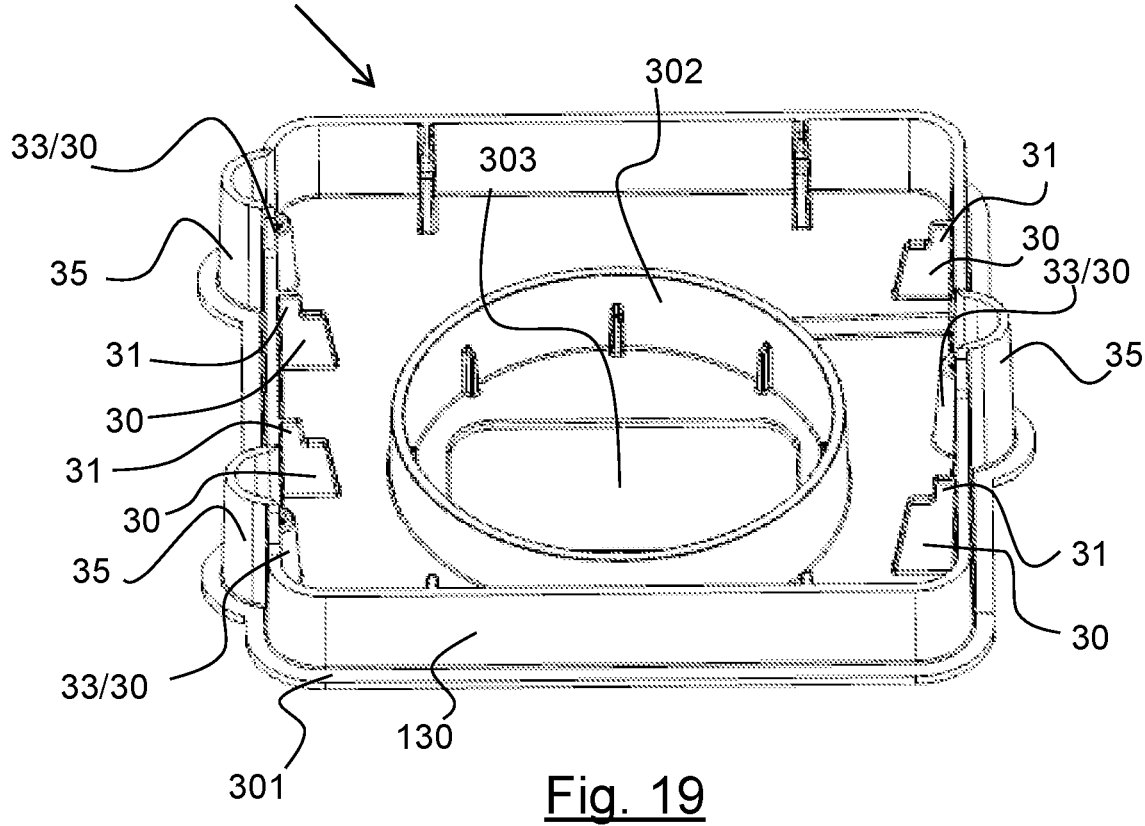
Figure 20:
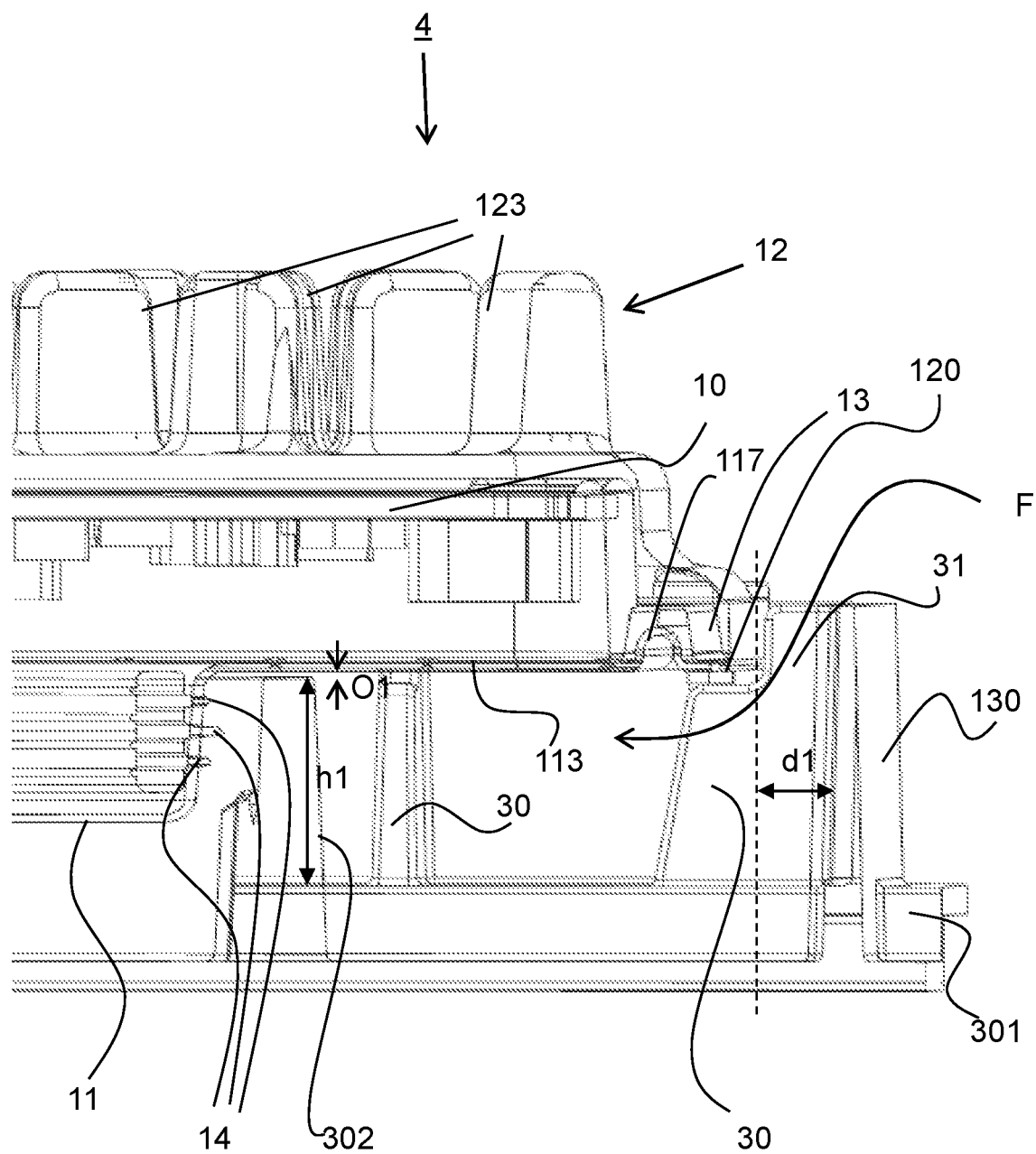

FIG. 1 is an exploded view of a housing for a printed circuit board for a lighting device according to a non-limiting embodiment, said housing having a protective cover and a heat sink, FIG. 2 shows the housing from FIG. 1 containing a printed circuit board and cooperating with a connector of a power supply harness, FIG. 3 is a partial top view of the heat sink of the housing in FIG. 1, according to a non-limiting embodiment, FIG. 4 is a top view of the heat sink of the housing in FIG. 1, according to a non-limiting embodiment, FIG. 5 is a view of the protective cover of the housing in FIG. 1 according to a non-limiting embodiment, said protective cover cooperating with a connector of a power supply harness, FIG. 6 is a magnified view of a portion of the heat sink in FIG. 3, FIG. 7 is a schematic cross-section view taken along the line A-A of the housing in FIG. 6 with a protection device according to a first non-limiting variant embodiment of a first non-limiting embodiment, FIG. 8 is a schematic cross-section view of the housing in FIG. 1 with a protection device according to a second non-limiting variant embodiment of a first non-limiting embodiment, FIG. 9 is a schematic cross-section view of the housing in FIG. 1 with a protection device according to a second non-limiting embodiment, FIG. 10 is a perspective view of an assembly for a lighting device for a motor vehicle including the housing in FIG. 1 and a secondary housing according to a first non-limiting embodiment, FIG. 11 is an exploded view of the assembly in FIG. 10, according to a non-limiting embodiment, FIG. 12 is a top view of the secondary housing of the assembly in FIG. 10, according to a non-limiting embodiment, FIG. 13 is the secondary housing in FIG. 12 on which the protective cover of the housing in FIG. 1 is arranged, according to a non-limiting embodiment, FIG. 14 is a perspective view of an assembly for a lighting device for a motor vehicle including the housing in FIG. 1 and a secondary housing according to a second non-limiting embodiment, FIG. 15 is a top view of the secondary housing of the assembly in FIG. 14, according to a non-limiting embodiment, FIG. 16 is the secondary housing in FIG. 15 on which the protective cover of the housing in FIG. 1 is arranged, according to a non-limiting embodiment, FIG. 17 is a side view of FIG. 16, FIG. 18 is a perspective view of an assembly for a lighting device for a motor vehicle including the housing in FIG. 1 and a secondary housing according to a third non-limiting embodiment, FIG. 19 is a top view of the secondary housing of the assembly in FIG. 18, according to a non-limiting embodiment, and FIG. 20 is a cross-section view of FIG. 19.

DESCRIPTION OF EMBODIMENTS OF THE INVENTION

Unless otherwise specified, elements that are identical in structure or function and that appear in multiple figures are indicated using the same reference signs.

The housing 1 for a printed circuit board 10 according to the invention is described with reference to FIGS. 1 to 20. In one non-limiting embodiment, this housing 1 with the printed circuit board 10 is designed to control the electrical power supply for a light source for a lighting device (not shown) for a motor vehicle.

In a non-limiting embodiment, the lighting device is a lighting and/or signaling device for a motor vehicle. In a non-limiting example, the lighting device is a headlamp.

In a non-limiting embodiment, the lighting device includes:
  at least one light source designed to emit light rays,
  an optical module designed to cooperate with said light rays from said at least one light source to produce a light beam,
  said housing 1 for the printed circuit board 10,
  a printed circuit board 10 seated in said housing 1,
  a secondary housing 3 designed to be assembled with the housing 1 for the printed circuit board 10

In a non-limiting embodiment, said at least one light source is part of a light-emitting diode.

Light-emitting diode shall mean any type of light-emitting diode including, in the non-limiting examples, LEDs (Light Emitting Diodes), OLEDs (Organic LEDs), AMO-LED (Active-Matrix-Organic LEDs) or FOLED (Flexible OLEDs). Motor vehicle shall mean any type of motorized vehicle.

As shown in FIGS. 1 to 14, the housing 1 for the printed circuit board 10 includes:
  a protective cover 11,
  a heat sink 12,
  a primary seal 13,
  a protection device 110, 120 for said primary seal 13.

The housing 1 is designed to receive a printed circuit board 10 as described below.

Printed Circuit Board 10

The printed circuit board 10 has a plurality of electronic components on at least one of the faces thereof.

In a non-limiting embodiment, the printed circuit board 10 is a printed circuit board assembly (PCBA). One of these electronic components is designed to control the electrical power supply of the light source. In this case, the housing 1 and the printed circuit board 10 seated in said housing 1 form a control device 2 for the electrical power supply for at least one light source for a lighting device as shown in FIG. 2. In a non-limiting embodiment, the electronic control component is a DC/DC converter.

The printed circuit board 10 and in particular the electronic components thereof, including the electronic control component, generate heat when in operation, which has to be evacuated to outside the housing 1. This heat is evacuated by the heat sink 12 as well as the protective cover 11.

The elements of the housing 1 are described in detail below.

Protective Cover 11

The protective cover 11 is shown in FIGS. 1, 2, 5, 7, 8, 11, 16, 17 and 20. The protective cover 11 is designed to be arranged on the heat sink 12 such as to protect the printed circuit board 10, this latter being arranged between the protective cover 11 and the heat sink 12.

The protective cover 11 is designed to be crimped onto the heat sink 12.

The protective cover 11 comprises:
  a base plate 113,
  a primary chimney 115.

In a non-limiting embodiment, the protective cover 11 is made by stamping or molding.

In a first non-limiting embodiment, the protective cover 11 is made of sheet metal or injected aluminum. In a non-limiting variant embodiment, the metal sheet is galvanized steel or aluminum.

In a second non-limiting embodiment, the protective cover 11 is made of a thermoplastic material containing heat-conducting particles. The particles in the thermoplastic material increase the thermal conduction of the heat to the outside of the housing 1. In a non-limiting variant embodiment, the thermoplastic material has a graphite additive.

In a third non-limiting embodiment, the protective cover 11 is made of zamak, i.e. an alloy of zinc, aluminum, magnesium and copper. This alloy enables the injection of more complex, harder parts. Furthermore, injected parts made of zamak have the same heat sink capacity as aluminum parts.

In a non-limiting embodiment shown in the figures, the protective cover 11 is flat.

In a non-limiting embodiment (not shown), the protective cover 11 has projections, for example fins or studs. This helps to increase the heat-exchange surface with an air flow F. An air flow F shown in FIG. 13 or 16 comes into contact with the protective cover 11. It can be seen that the air flow F can move in a plurality of directions as a function of the positioning of the housing 1 on the secondary housing 3.

In a non-limiting embodiment, the protective cover 11 has a secondary seal 14. The secondary seal 14 is arranged on the outer perimeter of the primary chimney 115. The secondary seal 14 seals the assembly between the protective cover 11 and a matching part that is the secondary housing 3 (as described below).

Base Plate 113

In the non-limiting embodiment in FIGS. 1, 2, 5-8, 10 and 12, the base plate 113 is substantially rectangular. In the non-limiting embodiment in FIGS. 16, 17 and 20, the base plate 113 is substantially square.

This base plate 113 is designed to at least partially close the housing 1 for the printed circuit board 10.

The base plate 113 comprises:
a lip 117,
at least one primary positioning device 118.

The lip 117 extends about the perimeter of the base plate 113 on one of the faces thereof opposite the heat sink 12. This lip 117 is designed to hold the primary seal 13 between the protective cover 11 and the heat sink 12 when the housing 1 is closed, as illustrated in FIGS. 7 and 8.

In a non-limiting embodiment, the lip 117 is formed during a stamping operation of the base plate 113 forming a channel 116 on the other face of the base plate 113.

In a non-limiting embodiment illustrated in FIG. 1, the base plate 113 has six primary positioning devices 118. In another non-limiting embodiment illustrated in FIG. 16, the base plate 113 has four primary positioning devices 118.

These primary positioning devices 118 are designed to cooperate with the secondary positioning devices 124 of the heat sink 12 for assembly of the protective cover 11 with said heat sink 12. These devices enable the protective cover to be crimped onto the heat sink 12. For this purpose, these devices have a crimping hole and, in one non-limiting embodiment, project from the perimeter of the base plate 113.

Primary Chimney 115

The primary chimney 115 is designed to receive the secondary seal 14.

The primary chimney 115 projects from the base plate 113. In the embodiment in FIGS. 1, 2, 5-8, 10, 12, 16 and 20, the primary chimney 115 is arranged at the center of the base plate 113. Said chimney is substantially cylindrical and has an opening 111. This opening 111 is arranged on the side opposite the heat sink 12 such as to receive a connector 16 that has a male portion 162 and a female portion 161, as shown in FIG. 2. The female portion 161 of the connector 16 is connected electrically by a power supply harness 163. The opening 111 is arranged in the primary chimney 115 and passes through the base plate 113 to enable the male portion 162 of the connector 16 to connect directly to the printed circuit board 10 via a connection zone 101 of said printed circuit board 10.

Primary Seal 13

The primary seal 13 is shown in FIGS. 1, 7, 8, 9 and 20.

The primary seal 13 is designed to create a seal between the protective cover 11 and the heat sink 12 when same are assembled, and more generally to seal the housing 1. Said seal thus protects the electronic components of the printed circuit board 10, in particular the component for controlling the electrical power supply of the light source or sources of the lighting device.

In non-limiting embodiments, the primary seal 13 is a plastic, rubber or polymer-glue seal.

The primary seal 13 is arranged between the protective cover 11 and the heat sink 12 when the housing 1 for the printed circuit board 10 is closed.

The primary seal 13 is designed to sit in a groove 125 of the heat sink 12 located close to the perimeter 121 of said heat sink 12. The primary seal 13 fits the lip 117. Thus, said seal includes a channel 132 shaped to match the lip 117 of the protective cover 11. The primary seal 13 is thus compressed between the lip 117 of the base plate 113 and the groove 125 of the heat sink 12 when the housing 1 is closed, as illustrated in FIGS. 7, 8 and 9.

Heat Sink 12

The heat sink 12 is shown in FIGS. 1 to 4, 6 to 10, 14, 18 and 20.

Said heat sink is designed to dissipate the heat released by the printed circuit board 10, notably by the electronic components thereof. An air flow F shown in FIGS. 10, 14, 16 and 17 for example comes into contact with the heat sink 12. It can be seen that the same air flow F comes into contact with the protective cover 11. It can be seen that 70% to 80% of the heat released by the printed circuit board 10 can then be dissipated by the heat sink 12.

In a non-limiting embodiment, the heat sink 12 is made by stamping or molding.

In a non-limiting embodiment, the heat sink 12 is made of sheet metal or injected aluminum.

In another non-limiting embodiment, the heat sink 12 is made of zamak.

In another non-limiting embodiment, the heat sink 12 is made of a thermoplastic material containing heat-conducting particles. In a non-limiting variant embodiment, the thermoplastic material has a graphite additive.

In a non-limiting embodiment (not shown), the heat sink 12 is flat.

In a non-limiting embodiment shown in the figures, the heat sink 12 has projections 123, for example fins or studs. This helps to increase the heat-exchange surface with the air flow F, thereby improving evacuation of the heat to outside the housing 1. In a non-limiting embodiment, the projections 123 are made with the heat sink 12 during a single injection operation.

As shown in FIG. 3, the heat sink 12 comprises:
a perimeter 121,
a groove 125,
at least one secondary positioning device 124,
at least one attachment device 128 to the secondary housing 3 (described below).

The perimeter 121 of the heat sink 12 delimits a central seat 126 that is designed to receive the printed circuit board 10. The central seat 126 has a bottom and at least one primary positioning device 127 for the printed circuit board 10 (as shown in FIGS. 2 and 11). In a non-limiting embodiment, the primary positioning device 127 is a crimping pin. In a non-limiting example, the central seat 16 has two crimping pins.

The crimping pins 127 are designed to receive and block the printed circuit board 10 in the central seat 126. These crimping pins 127 are designed to be seated in the crimping holes 102 of the printed circuit board 10.

As described above, the groove 125 is designed to receive the primary seal 13. Said groove is positioned close to the perimeter 121 of said heat sink 12. In a non-limiting embodiment, said at least one secondary positioning device 124 is a pin designed to be inserted in a crimping hole 118 of the protective cover 11.

In a non-limiting embodiment, said at least one attachment device 128 is an attachment lug designed to receive a screw 129. This assembly of attachment lug 128 and screw 129 enables the heat sink 12 to be assembled and held on the secondary housing 3. In a non-limiting example shown in FIGS. 10 and 14, the heat sink 12 has three attachment lugs 128. This makes it possible to obtain an assembly 4 (described below) for a lighting device for a motor vehicle comprising the housing 1 for the printed circuit board 10 assembled with the secondary housing 3 for a lighting device as illustrated in FIGS. 10 and 14.

Protection Device 110, 120

The protection device 110, 120 helps to protect the primary seal 13 against external attack, from pressurized water in a non-limiting example. This pressurized water is used to clean the engine compartment containing the lighting device and can damage the primary seal 13, thereby degrading the seal of the housing 1. The protection device 110, 120 therefore helps to seal the housing 1 and to protect the electronic components of the printed circuit board 10.

The protection device 110, 120 is described according to two non-limiting embodiments.

First Embodiment

In a first non-limiting embodiment shown in FIGS. 1-3, 6, 7 and 8, the protection device has at least one wall 120 arranged on at least one portion of the perimeter 121 of the heat sink 12.

In a non-limiting embodiment, the wall 120 is made with the heat sink 12 during a single injection operation.

The wall 120 acts as a barrier to divert the water flow W initially directed towards the primary seal 13, as shown by the arrows in FIG. 7. The primary seal 13 seated in the groove 125 of the heat sink 12 is thus better protected. In a first non-limiting variant embodiment shown in FIG. 6, the wall 120 only extends about a portion of the perimeter 121 of the heat sink 12, where the pressurized water flow W has easy access. Thus, the wall 120 does not extend over the corners 1211 of the perimeter 121, thees latter being less exposed to the pressurized water flows W.

In a second non-limiting variant embodiment (not shown), the wall 120 extends over all of the perimeter 121 of the heat sink 12. Thus, the wall 120 also extends over the corners 1211 of the perimeter 121 of the heat sink 12. In a non-limiting embodiment illustrated, the wall 120 has an unadorned rounded shape. This shape is easy to form by molding. In a non-limiting variant embodiment illustrated, this unadorned rounded shape is a semi-circle.

In a first non-limiting variant embodiment shown in the cross-section view in FIG. 7, the protection device has just one wall 120 arranged on at least one portion of the perimeter 121 of the thermal device 12. In a non-limiting embodiment of this first variant shown in FIG. 7, the wall 120 is flush with the protective cover 11. This helps to minimize the size of the housing 1. Thus, FIG. 7 shows how the upper portion of the wall 120 is at the same level as the protective cover 11. In other words, the height h0 of the wall 120 is the same as the thickness e0 of the protective cover 11. In a non-limiting embodiment, the thickness e0 is substantially between 0.5 mm (millimeters) and 1 mm.

In another non-limiting embodiment (not shown) of this first variant, the wall 120 projects beyond the protective cover 11. In other words, the height h0 of the wall 120 is greater than the thickness e0 of the protective cover 11. This enhances the protection of the seal 13 provided by the wall 120.

In a second non-limiting variant embodiment shown in the cross-section view in FIG. 8, the protection device has two walls 120 arranged on at least one portion of the perimeter 121 of the thermal device 12. In an embodiment of this variant, the edge 110 of the protective cover 11 extends to cover both walls 120. In particular and as illustrated, the edge 110 fits the shape of the two walls and the junction 1200 between the two walls 120. In another embodiment of this variant (not shown), the protective cover 11 has an edge 110 that extends such as to cover the two walls 120 and an intermediate flanged edge that forms a rib and covers the wall 120 closest to the perimeter 121 of the heat sink 12.

Second Embodiment

In a second non-limiting embodiment shown in FIG. 9, the protection device has a flanged edge 110 arranged on the protective cover 11.

This flanged edge 110 is designed to rest on at least one portion 1210 of the perimeter 121 of the heat sink 12. In a non-limiting embodiment, this portion 1210 of the perimeter 121 is inclined. Thus, the flanged edge 110 bearing against the portion 1210 of the perimeter 121 closes the groove 125 of the heat sink 12 in which the seal 13 is seated. The flanged edge 110 acts as a barrier to divert the water flow W initially directed towards the primary seal 13, as shown by the arrows in FIG. 9. The primary seal 13 seated in the groove 125 of the heat sink 12 is thus better protected.

Assembly 4

The assembly 4 is shown in FIGS. 10 and 14 according to two non-limiting embodiments.

The assembly 4 includes the housing 1 for the printed circuit board 10 described above and assembled with a secondary housing 3.

If the lighting device is a front headlamp of a motor vehicle in a non-limiting embodiment, the secondary housing 3 is known as a headlamp housing.

In non-limiting embodiments, the housing 1 for the printed circuit board 10 can be assembled with the secondary housing 3 on the rear face thereof, on the bottom or one of the sides thereof. The front face of the secondary housing 3 enables the light beam of the lighting device to perform the lighting function.

In one non-limiting embodiment, the secondary housing 3 is made of a plastic material.

The secondary housing 3 comprises:
a base body 301, and
a secondary chimney 302.

The base body 301 is designed to receive the control device 2 for the electrical power supply, i.e. the housing 1 and the printed circuit board 10. The secondary chimney 302 is designed to receive the primary chimney 115 of the protective cover 11, this latter fitting into said secondary chimney 302. The secondary seal 14 is then compressed between the primary chimney 115 and the secondary chimney 302 to seal the link between the chimney 115 and the secondary chimney 302. The assembly 4 is thus sealed. The secondary chimney 302 has an opening 303 (shown in FIG. 12 or 15) that extends as far as the base body 301. This opening 303 faces the opening 111 of the primary chimney 115. The female portion 161 of the connector 16 can be passed through these openings 111, 303 to connect same with the male portion 162 of said connector 16, said male portion 162 being seated in the housing 1.

The height h1 of the secondary chimney 302 is high enough to receive the secondary seal 14.

The secondary housing 3 comprises (arranged on the base body 301):
at least one guide device 31, 35 for the housing 1,
at least one attachment device 33 for the housing 1,
at least one bearing device 30, 30' for the housing 1.

In a first non-limiting embodiment shown in FIGS. 10 to 17, the secondary housing 3 has no protective wall.

In a second non-limiting embodiment shown in FIGS. 18 to 20, the secondary housing 3 has a protective wall 130.

These elements are described in detail below.

Guide Device 31, 35

The guide device 31, 35 is designed to guide the housing 1 for the printed circuit board 10 when same is being positioned on the secondary housing 3.

In a first non-limiting embodiment shown in FIGS. 12 and 13, the guide device has at least one rib 31. The rib 31 has a section 31'. As shown in FIG. 13, the protective cover 11 of the housing 1 is designed to come into contact with said section 31' to be guided in relation to the secondary housing 3 until same bears against the bearing device or devices 30, 30'. In a non-limiting example shown in FIGS. 12 and 13, the secondary housing 3 has eight ribs 31. Accordingly, the protective cover 11 is correctly positioned on the secondary housing 3 and the opening 111 of the primary chimney 115 is also correctly positioned opposite the opening 303 in the secondary housing 3.

In a second non-limiting embodiment shown in FIGS. 14 to 17, the guide device has at least one gutter 35. This gutter 35 is a rounded part. The gutter 35 is designed to guide one of the attachment lugs 128 of the heat sink 12 in translation until the heat sink 12 bears against the bearing device or devices 30. In a non-limiting example shown in FIGS. 14 to 17, the guide device has three gutters 35.

Naturally, the first embodiment and the second embodiment can be combined as shown in FIGS. 18 to 20. In this case, the guide device has at least one rib 31 and at least one gutter 35.

Attachment Device 33

The attachment device 33 is designed to receive a screw 129 to attach the housing 1 for the printed circuit board 10 to the secondary housing 3.

In a non-limiting embodiment, the attachment device 33 is a shaft. In a non-limiting embodiment, the screw 129 is thread-forming.

In a non-limiting example embodiment shown in FIGS. 12, 13, 15, 16 and 18, the secondary housing 3 has three shafts 33.

The attachment device 33 is arranged to maintain a space between the protective cover 11 of the housing 1 and the secondary housing 3 such as to enable the air flow F to pass between said protective cover 11 and said secondary housing 3, as illustrated notably in FIG. 17. For this purpose, the height h2 of the attachment device 33 is such as to enable the air flow F to pass. This air flow F thus passes between the protective cover 11 and the base body 301 of the secondary housing 3. The air flow F thus comes into contact with the protective cover 11. This latter then acts as a heat sink for the printed circuit board 10, in particular for the electronic components thereof, including the electronic control component. It can be seen that 20% to 30% of the heat released by the printed circuit board 10 can then be dissipated by the protective cover 11.

In a non-limiting embodiment shown in FIGS. 14 to 17, the guide device in the form of a gutter 35 surrounds the attachment device 33.

Bearing Device 30, 30'

The bearing device 30, 30' is designed to receive the housing 1 for the printed circuit board 10 when same is attached to the secondary housing 3.

In a first non-limiting embodiment shown in FIG. 12, the bearing device has a primary rib 30 and a secondary rib 30'. The primary rib 30 extends the guide device 31. The height of the primary rib 30 is less than the guide device 31. The secondary rib 30' extends the attachment device 33. The height of the primary rib 30 and the secondary rib 30' is substantially the same as the height h2 of the attachment device 33. This provides a dual support for the housing 1. A first with the bearing device 30, 30' and a second with the attachment device 33 where same is a shaft. The first support enables the protective cover 11 to be pressed against the heat sink 12 to provide the EMC seal, as described below. The second support helps to limit deformation of the protective cover 11.

The primary and secondary ribs 30, 30' provide points of contact on the protective cover 11, this latter bearing against said primary and secondary ribs 30, 30'.

In a non-limiting embodiment shown in FIG. 12 or 18, the secondary housing 3 has a plurality of primary ribs 30 (eight in the non-limiting example illustrated) and secondary ribs 30' (two in the non-limiting example illustrated) distributed regularly over the base body 301 of the secondary housing 3. This enables the protective cover 11 to be pressed against the heat sink 12 when the housing 1 is assembled on the secondary housing 3. The protective cover 11 is thus pressed against the heat sink 12 at regular intervals, which guarantees a good seal against electromagnetic radiation, known as EMC sealing. Thus, the electronic components of the printed circuit board 10 of the housing 1 are well protected against the electromagnetic radiation emitted by the other electronic components of the motor vehicle (known as EMC emissions) and the other electronic components are well protected against the electromagnetic radiation emitted by the printed circuit board 10, in particular by the electronic components thereof.

In a second non-limiting embodiment shown in FIG. 15, the bearing device 30 is the attachment device 33 described above. The protective cover 11 then bears against the shafts 33 described above.

Naturally, the first embodiment and the second embodiment can be combined as shown in FIGS. 18 to 20. In this case, there is at least one bearing device that has a first rib 30 and a second rib 30' and at least one bearing device that is the attachment device 33.

It can be seen that the height h2 is the same as the height h1 of the secondary chimney 302 of the secondary housing 3 plus a clearance O1 (shown in FIG. 17). In a non-limiting example, the height h1 is substantially equal to 13.8 mm (millimeters) and the clearance O1 is substantially equal to 0.5 mm. The secondary chimney 302 is thus lower than the bearing device 30, 30'. This leaves a clearance O1 between the protective cover 11 and the secondary chimney 302 when said housing 1 is assembled on the secondary housing 3 and in particular when said housing 1 bears against the bearing device or devices 30, 30'. The secondary chimney 302 is thus lower than the protective cover 11. Thus, when the housing 1 is attached to the secondary housing 3 using the attachment devices 33 and the screws 129, the secondary chimney 302 neither touches nor bears against the protective cover 11. Thus, this latter does not damage the printed circuit board 10 since the housing 1 is screwed to the secondary housing 3.

Protective Wall 130

The protective wall 130 is shown in FIGS. 18 to 20.

The protective wall 130 is designed to protect the secondary seal 14 against attack from a pressurized fluid, in a non-limiting example. Indeed, as described above, there is a clearance O1, shown in FIG. 20, between the chimney 302 of the secondary housing 3 and the base plate 113 of the protective cover 11. Consequently, a pressurized fluid can flow between the secondary housing 3 and the protective cover 11 (in particular the base plate 113 thereof) and damage said secondary seal 14.

The protective wall 130 is arranged at a distance from the perimeter 121 of the heat sink 12. This enables an air flow F to pass between the secondary housing 3 and the protective cover 11 and to come into contact with said protective cover 11 (in particular the base plate 113 thereof). The heat dissipation from the printed circuit board 10 is thus ensured by said protective cover 11, the latter not being confined. In a non-limiting example, the protective wall 130 is arranged at a distance d1 of between 5 mm and 10 mm from the perimeter 121 of the heat sink 12. This range of values enables an air flow F to pass correctly between the secondary housing 3 and the protective cover 11.

Thus, removing the protective wall from the secondary housing 3 in the prior art according to the first embodiment shown in FIGS. 1 to 17 and replacing same with a protection device (wall 120 and/or flanged edge 110) on the housing 1 for the printed circuit board 10 makes it possible:

to continue ensuring that the housing 1 is sealed notably by protecting the primary seal 13, and for the electronic control component of the printed circuit board 10 not to be confined by a protective wall on the side of the secondary housing 3, for an air flow F to pass into the assembly 4, specifically between the protective cover 11 and the secondary housing 3 such that this air flow F comes into contact with said protective cover 11. The protective cover 11 is thus aerated and cooled by the air flow F, as well as acting as a heat sink.

In a lighting device application, it is possible to substantially lower the temperature of the housing by 7° C. compared to the prior art comprising a protective wall on the secondary housing 3 arranged a few tenths of a millimeter from the heat sink 12.

Thus, in addition to the protection device (wall 120 and/or flanged edge 110) on the housing 1 for the printed circuit board 10, adding the protective wall 130 to the secondary housing 3 at a distance from the heat sink 12 according to the second embodiment shown in FIGS. 18 to 20 makes it possible:

to ensure the seal of the assembly 4 notably by protecting the secondary seal 14, and for the electronic control component of the printed circuit board 10 not to be confined by a protective wall on the side of the secondary housing 3, which is stuck to the heat sink 12, for an air flow F to pass into the assembly 4, specifically between the protective cover 11 and the secondary housing 3 such that this air flow F comes into contact with said protective cover 11. The protective cover 11 is thus aerated and cooled by the air flow F, as well as acting as a heat sink.

In a lighting device application, it is possible to substantially lower the temperature of the housing by 6° C. compared to the prior art comprising a protective wall on the secondary housing 3 arranged a few tenths of a millimeter from the heat sink 12.

Naturally, the description of the invention is not limited to the embodiments described above.

Thus, in a non-limiting embodiment, there are more than three attachment devices 128 for the heat sink 12.

Thus, the invention described notably has the following advantages:

the invention effectively protects the primary seal 13 of the housing 1 for the printed circuit board 10 against external attack against said housing 1, notably against attack from a pressurized fluid, the invention effectively protects the secondary seal 14 of the housing 1 for the printed circuit board 10 against external attack against said housing 1, notably against attack from a pressurized fluid, the invention prevents all fluid from entering the housing 1, which notably protects the electronic control component of the printed circuit board 10, the invention improves the heat dissipation of the housing 1 for the printed circuit board 10 by enabling an air flow F to pass between the protective cover 11 of the housing 1 and the secondary housing 3. The invention thus enables the protective cover 11 to also act as a heat sink, the EMC emissions from the housing 1 for the printed circuit board 10 are limited, the invention helps to protect the housing 1 for the printed circuit board 10 against EMC emissions from other components of the motor vehicle, and the assembly of the different component parts of the lighting device is facilitated.

The invention claimed is:

1. A housing for a printed circuit board for a lighting device for a motor vehicle, the housing comprising:
    a protective cover arranged on a heat sink,
    the heat sink arranged to receive the printed circuit board,
    a peripheral primary seal arranged between the protective cover and the heat sink, positioned inside a groove along the perimeter of the heat sink, and
    a protection device for the primary seal.

2. The housing according to claim 1, wherein the protective cover has an opening on the side opposite the heat sink that is arranged to receive a connector.

3. The housing according to claim 2, wherein the protective cover has a secondary seal arranged beside the opening.

4. The housing according to claim 1, wherein the protection device has at least one wall arranged on at least one portion of the perimeter of the heat sink.

5. The housing according to claim 4, wherein the at least one wall is flush with or projects beyond the protective cover.

6. The housing according to claim 1, wherein the protection device has a flanged edge arranged on the protective cover that is arranged to rest on at least one portion of the perimeter of the heat sink.

7. The housing according to claim 1, wherein the heat sink and/or the protective cover is flat or has projections.

8. A control device for controlling the electrical power supply for at least one light source for a lighting device, in which the control device has a housing according to claim 1, and a printed circuit board seated in the housing.

9. An assembly for a lighting device for a motor vehicle including a housing for a printed circuit board according to claim 1, that is assembled with a secondary housing for a lighting device.

10. The assembly according to claim 9, wherein the secondary housing has at least one attachment device for the housing.

11. The assembly according to claim 9, wherein the secondary housing has at least one bearing device for the housing.

12. The assembly according to claim 9, wherein the secondary housing has at least one guide device for the housing.

13. The assembly according to claim 9, wherein the secondary housing has a protective wall arranged at a distance from the perimeter of the heat sink of the housing for the printed circuit board.

14. The assembly according to claim 13, wherein the protective wall is arranged at a distance substantially between 5 mm and 10 mm from the perimeter of the heat sink.

15. A lighting device for a motor vehicle, in which the lighting device comprises:
    at least one light source arranged to emit light rays,
    an optical module arranged to cooperate with the light rays from the at least one light source,
    a housing for a printed circuit board according to claim 1,
    a printed circuit board seated in the housing, and
    a secondary housing arranged to be assembled with the housing for a printed circuit board.

16. The lighting device according to claim 15, wherein the at least one light source is part of a light-emitting diode.

17. The housing according to claim 2, wherein the protection device has at least one wall arranged on at least one portion of the perimeter of the heat sink.

18. The housing according to claim 2, wherein the protection device has a flanged edge arranged on the protective cover that is arranged to rest on at least one portion of the perimeter of the heat sink.

19. The housing according to claim 2, wherein the heat sink and/or the protective cover is flat or has projections.

20. A control device for controlling the electrical power supply for at least one light source for a lighting device, in which the control device has a housing according to claim 2, and a printed circuit board seated in the housing.

* * * * *